(12) United States Patent
Morse et al.

(10) Patent No.: US 6,452,220 B1
(45) Date of Patent: Sep. 17, 2002

(54) CURRENT ISOLATING EPITAXIAL BUFFER LAYERS FOR HIGH VOLTAGE PHOTODIODE ARRAY

(75) Inventors: Jeffrey D. Morse, Martinez; Gregory A. Cooper, Pleasant Hill, both of CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/733,858

(22) Filed: Dec. 8, 2000

Related U.S. Application Data
(60) Provisional application No. 60/169,964, filed on Dec. 9, 1999.

(51) Int. Cl.[7] ................... H01L 31/072; H01L 31/109; H01L 31/0328; H01L 31/0336
(52) U.S. Cl. .................. 257/183; 257/186; 257/199; 257/441
(58) Field of Search ................. 257/148, 183–184, 257/186–189, 199–200, 438, 441, 461; 438/48, 57, 77, 93, 94

(56) References Cited

U.S. PATENT DOCUMENTS

| | | | | |
|---|---|---|---|---|
| 4,739,385 A | * | 4/1988 | Bethea et al. | 257/184 |
| 4,774,554 A | | 9/1988 | Dentai et al. | 357/17 |
| 5,049,962 A | | 9/1991 | Huang et al. | 357/30 |
| 5,061,652 A | | 10/1991 | Bendernagel et al. | 437/64 |
| 6,100,546 A | | 8/2000 | Major et al. | 257/103 |
| 6,133,615 A | | 10/2000 | Guckel et al. | 257/446 |
| 6,242,762 B1 | * | 6/2001 | Brown et al. | 257/104 |
| 6,359,322 B1 | * | 3/2002 | Haralson et al. | 257/438 |

FOREIGN PATENT DOCUMENTS

EP        0308335 B1    10/1993

* cited by examiner

Primary Examiner—Olik Chaudhuri
Assistant Examiner—Theresa T. Doan
(74) Attorney, Agent, or Firm—Alan H. Thompson

(57) ABSTRACT

An array of photodiodes in series on a common semi-insulating substrate has a non-conductive buffer layer between the photodiodes and the semi-insulating substrate. The buffer layer reduces current injection leakage between the photodiodes of the array and allows optical energy to be converted to high voltage electrical energy.

9 Claims, 4 Drawing Sheets

CURRENT ISOLATING EPITAXIAL BUFFER LAYERS FOR HIGH VOLTAGE PHOTODIODE ARRAY

RELATED APPLICATION

This application relates to U.S. Provisional Application No. 60/169,964 filed Dec. 9, 1999, and claims priority thereof.

The United States Government has rights in this invention pursuant to Contract No. W-7405-ENG-48 between the United States Department of Energy and the University of California for the operation of Lawrence Livermore National Laboratory.

BACKGROUND OF THE INVENTION

Linear arrays of photovoltaic semiconductor diodes are used to produce higher voltages than a single diode can produce. Fabricating such arrays monolithically (on a common substrate) using mass production techniques common to the semiconductor industry is preferable to the manual assembly and interconnection of individual diodes. Monolithically fabricated arrays can be adversely affected by parasitic electrical currents flowing between the individual diodes through the substrate reducing the usable current and voltage produced by the array. One identified cause of parasitic substrate conduction is the generation of charge carriers in the substrate by illumination of the substrate in the regions between the diodes. Two methods have been identified to reduce or eliminate this effect; one is to use substrates that do not become conductive when illuminated and the other is to block the light from entering the substrate.

Using non-photo-conductive substrates has been demonstrated for silicon diode arrays but the silicon produced is either polycrystalline or amorphous. Silicon, being an indirect bandgap material, has an inherently low efficiency at converting photons into usable electrical current. Making the silicon polycrystalline or amorphous reduces the efficiency even further. The photon to-usable-current efficiency can be substantially improved by using single crystal, direct bandgap semiconductors. Single crystal, direct bandgap semiconductors are the preferred materials for high efficiency applications. However, fabricating high quality, single crystal semiconductor diodes on insulating substrates has been very difficult. Substrates which allow the formation of single crystal diodes tend also to be susceptible to photo-generated carrier production.

Methods for blocking the light from entering the substrates required for the fabrication of single crystal, direct bandgap semiconductors have also been demonstrated. Such light blocking techniques have been limited to small differences in electrical potential (10 volts or less) between spaced diodes. The reduction of current leakage between closely spaced diodes in photodetector diode arrays has been discussed in U.S. Pat. Nos. 5,049,962; 5,061,652; and 6,133,615. Other approaches have been based on doped direct bandgap materials (e.g., U.S. Pat. No. 4,774,554 to Dentai, et al. An example of a photodiode array containing direct bandgap buffer materials on insulating substrates is discussed by Major et al (U.S. Pat. No. 6,100,546). However, a need still exists for photodiode arrays for high voltage power generation, using direct bandgap materials on semi-insulating substrates.

SUMMARY OF THE INVENTION

Briefly, the invention includes an array of photodiodes on a semi-insulating substrate, a method for fabricating such photodiodes, and a system for converting optical energy to high voltage electrical energy. The reduction or elimination of the injection of electrical charge carriers into a common semi-insulating substrate having an array of two or more photodiodes (e.g., photocells) at different electrical potentials is provided by positioning a non-conductive buffer layer containing at least one single crystal semiconductor material between the substrate and spaced diodes. Such an array can provide reduced current injections and voltage collapse and can be illuminated with uniform light beam profiles to increase efficiency.

The invention provides high quality lattice matching (i.e., within about 5%) between the semiconductor materials of the non-conductive single crystal, buffer layer and the semiconductor materials of the mesa photodiodes on the array, particularly during epitaxial growth fabrication of the array.

DETAILED DESCRIPTION OF THE INVENTION

In a system of the invention, the direct generation of high voltage with an array of low voltage photodiodes involves optically illuminating an array of photodiodes simultaneously. While the low voltage power generation of approximately six volts has been previously demonstrated with commercial arrays of photodiodes, many applications require the generation of significantly higher voltages (hundreds to thousands). The arrays of photodiodes of the present invention can provide electrical potential differences of above 10 volts, usually at least about 16 volts, often at least 50 volts, normally at least 90 volts, and easily capable of more than 1000 volts.

Optical energy is transmitted by conventional means, including solar radiation, free space, and optical wave guides such as optic fiber, to an array of photovoltaic cells or photodiodes arranged to typically minimize footprint. An optical homogenizer can be located between the optical transmission and the array to form a uniform laser beam profile for illuminence onto the array. In the generation of, for example, 1200 volts using discrete arrays of GaAs-containing photodiodes, a limitation in such voltage scale-ups and compact, integrated photodiode arrays is excessive leakage current due to parasitic electric fields as arrays of series diodes are placed in parallel rows, for instance in serpentine fashion, to minimize footprint to provide a compact array. Although in many instances, rows of photodiodes are interconnected in an array, any geometric pattern can be employed. The result can be a collapse of the voltage across each component of the array, thereby degrading the overall voltage generated by the entire array of photodiodes. An integrated photodiode array can utilize a current isolating buffer layer integrated with the photodiode array.

Figure 1A:
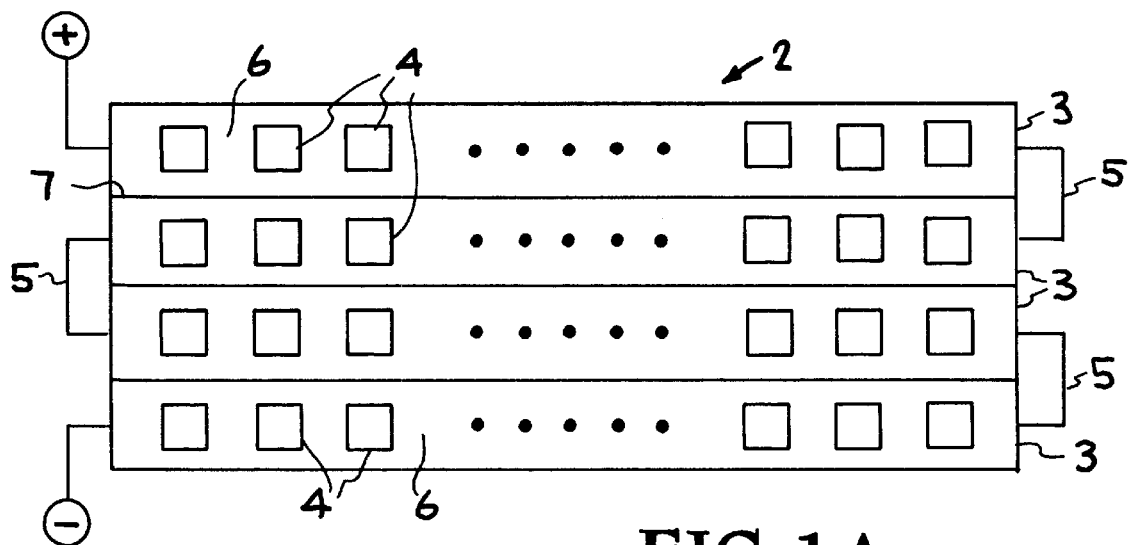
FIG. 1A illustrates a multiple row array of diodes including a maximum voltage gradient area where excess current leakage often occurs during operation of the array.
Figure 1B:
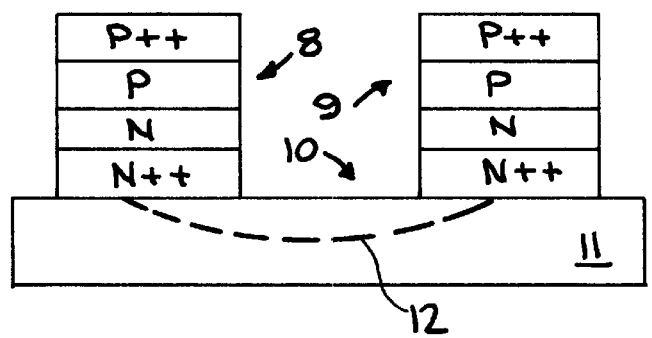
FIG. 1B illustrates current leakage between a non-independent pair of diodes.

High voltage photovoltaic arrays are designed as a means to provide electrical power via optical energy for a variety of applications. FIG. 1A illustrates a top view of an example of a high voltage array 2 in which a plurality of rows 3 containing spaced photodiodes 4 are fabricated in a serpentine fashion on a semi-insulating substrate 6 and to which optical energy via, for instance, optic fiber, is transmitted. Each row 3 of array 2 of FIG. 1A is interconnected by a conductive interconnect 5 to provide an in series connection of the photodiodes and has, for example, 90 photodiodes at about 1 volt/photodiode. FIG. 1B illustrates a side view of two adjacent diodes 8 and 9 grown in spaced rows separated by a distance 10 on a semi-insulating substrate 11. A limitation of such arrays has been a collapse of the voltage across each photodiode of the array, thereby degrading the overall voltage generated by the entire photocell. Although not bound by any theory, this collapse can be due to excess leakage current 12 being generated between the rows of the photodiode array having different electrical potentials as the rows are placed in parallel (see FIG. 1A and FIG. 1B), which results (in this example) in a maximum voltage difference of 180 V (depicted at 7 in FIG. 1A and 10 in FIG. 1B) at the unconnected ends of adjacent diode array rows or columns. (1 Volt/diode×90 diodes/row=90 Volt differential/row).

Figure 1C:
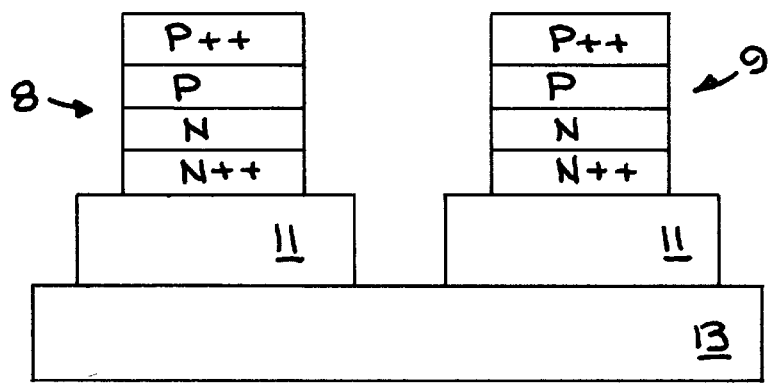
FIG. 1C illustrates the physical separation method for reduction of current leakage between an independent pair of diodes.

With a distance, for example, of about 300 µm between adjacent rows, the electric field strength between certain portions of each row is high enough to inject current into the semi-insulating substrate resulting in a leakage current path between adjacent rows. As illustrated in FIG. 1C, such a problem can be solved by physically separating adjacent rows 8 and 9 by, for example, dicing the combination of photodiode and semi-insulating substrate 11 and connecting the interconnects at each end by an electrical connector, such as a wire, thus the substrates can then be isolated electrically, on for instance an insulating substrate 13. However, this approach does not increase the overall voltage of the array and/or reduce the footprint. An array having current isolating buffer layers between the photo diode structures and the semi-insulating substrate provides a solution to such a problem.

Figure 2A:
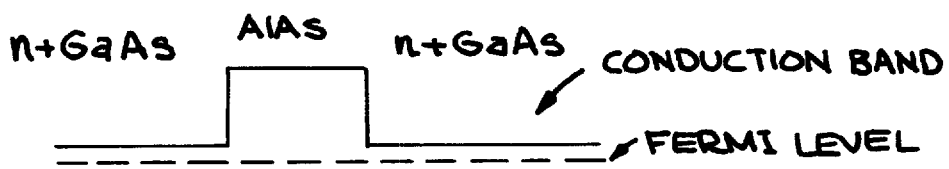
FIG. 2A illustrates a band diagram for n-GaAs/AlAs/n+ GaAs structure at equilibrium.
Figure 2A:
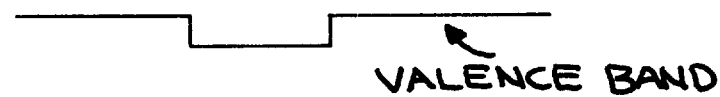
Figure 2B:
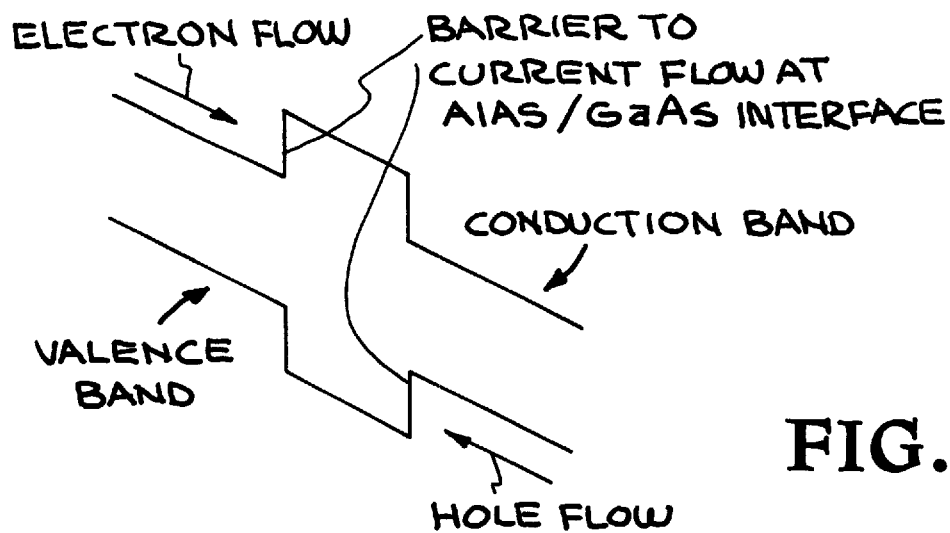
FIG. 2B illustrates band diagrams with applied voltage showing barriers to current flow at AlAs/GaAs interface.

To reduce or eliminate the leakage current between adjacent rows, a current isolating buffer layer can be positioned between the semi-insulating substrate and the photodiode structure to act as a barrier to current flow. For example, a photodiode array is fabricated using a single crystal semi-insulating substrate such as a Gallium Arsenide (GaAs) with material grown by any of the conventional deposition methods, such as metal-organic chemical vapor deposition (MOCVD) or molecular beam epitaxy (MBE). In a resulting array of photodiode structures, the growth of single crystal buffer layers, such as Aluminum Arsenide (AlAs) epitaxial layers, on the GaAs substrate provides an offset in the conduction and valence bands at the GaAs-AlAs interface, as illustrated in FIG. 2A. As the voltage across the structure increases, causing the bands to bend, the path of flow of electrons is impeded by this band offset (as shown in FIG. 2B), until the effective distance across the barrier becomes small enough such that the electrons can tunnel through the barrier. At this point the current has an exponential dependence on voltage. In general, the thicker the barrier layer, the higher the voltage at which the electrons begin to conduct current, although some materials can provide effective barrier layers at thinner layers or within a range of micron thicknesses.

Figure 3:
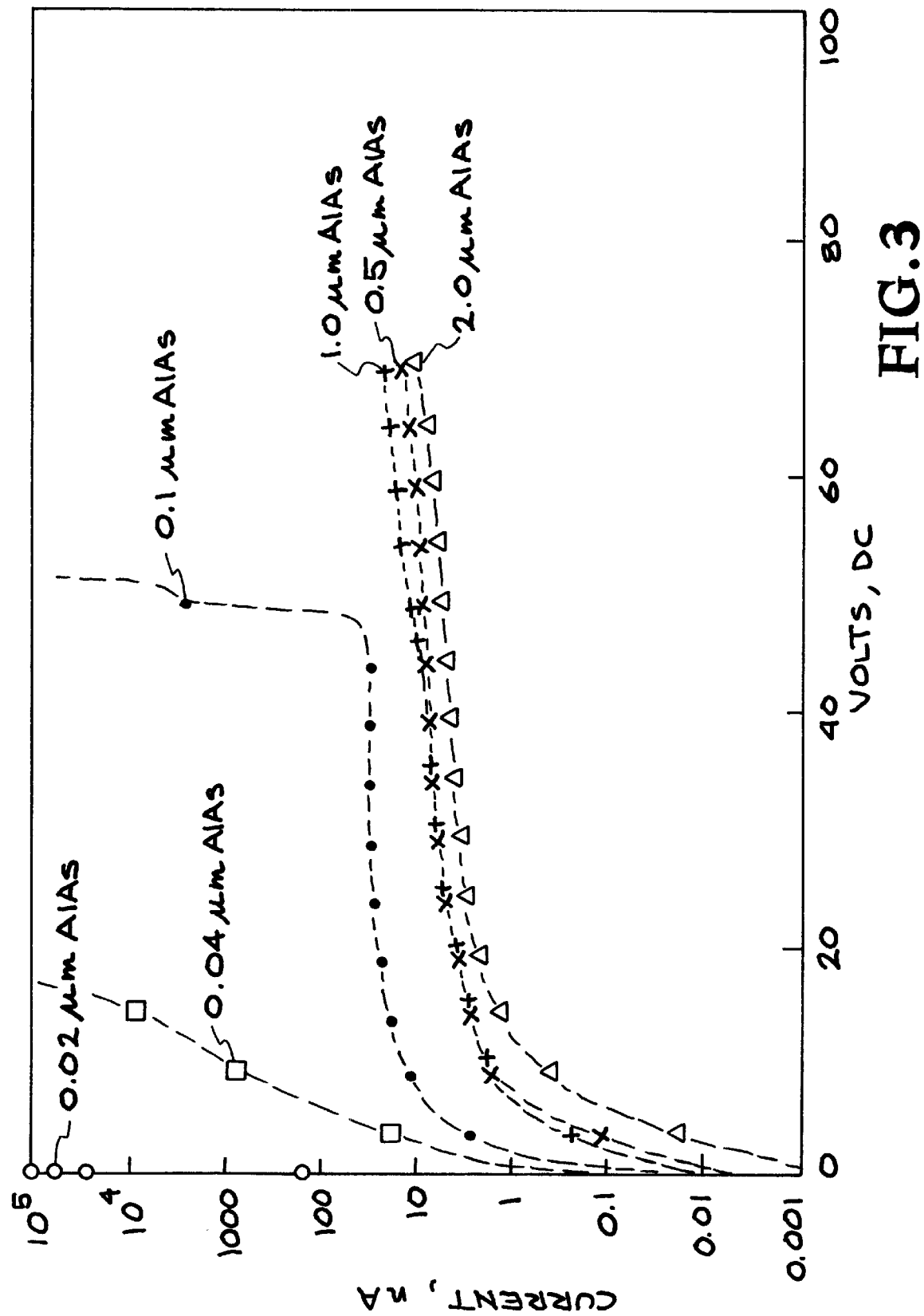
FIG. 3 illustrates, in graphical form, the order of magnitude of leakage current reduction at different buffer layer thicknesses.

On a semi-insulating GaAs substrate, leakage test structures are grown having a thickness greater than about 1 µm, and usually in the range from about 0.1 µm to about 6.0 µm, by, for instance, MOCVD. An AlAs or AlGaAs buffer layer is first grown on the semi-insulating substrate varying in thickness from about 0.02 µm to about 2 µm, followed by a 0.5 µm thick layer of n+GaAs to provide an electrical contact. The active devices are fabricated by forming a mesa ridge structure on which a contact metal pad is patterned. The current vs. voltage characteristics are then measured as a function of the thickness of buffer layer. Such results are shown in FIG. 3. Such data indicate that the leakage current is reduced by 3–5 orders of magnitude as the AlAs layer thickness is increased. Although the data indicate that layers of thickness from about 0.5 micron to about 2.0 micron are effective, a range from about 0.2 to about 2.0 can be highly effective.

Figure 4:
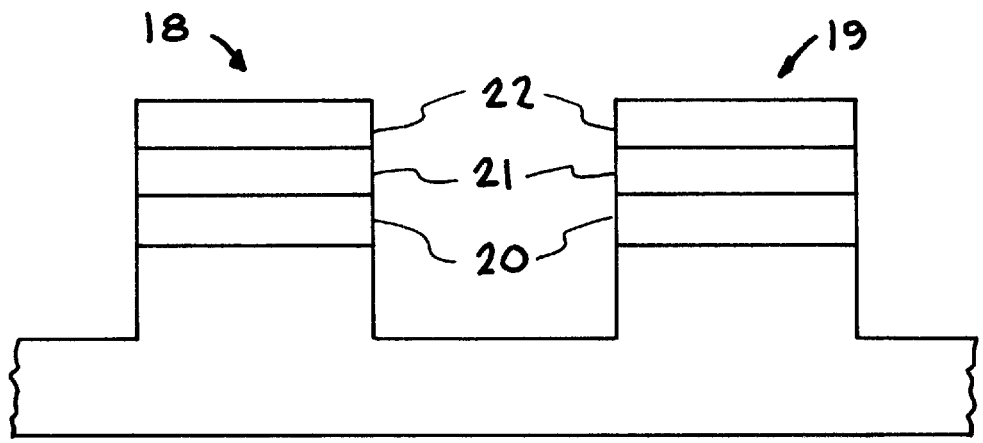
FIG. 4 illustrates at least two photodiodes and a buffer layer on a common semi-insulating substrate.

During operation of a system of the invention, the injection of electrical charge carriers into the common substrate containing two or more photodiodes at different electrical potentials, is reduced or essentially eliminated by introducing a non-conductive buffer layer, usually a single crystal material containing semiconductor materials, that contacts and is positioned between a single crystal, semi-insulating substrate and a single crystal semiconductor material of the photodiode. Common techniques employed to epitaxially grow single crystal semiconductor layer or layers on compatible single crystal semiconductor substrates can be employed in the invention. FIG. 4 illustrates a portion of an array of spaced photodiodes 18 and 19 positioned on a clean, semi-insulating, single crystal substrate 15. A non-conductive, single crystal buffer layer 20 (or layers) is positioned between each photodiode and semi-insulating, single crystal substrate 15 and grown to a thickness sufficient to reduce (or essentially eliminate) charge injection for the electrical potential differences anticipated or desired. The single crystal layers of the active photodiode device, such as n-type semiconductor 21 over which p-type semiconductor 22 (or vice versa) are grown in juxtaposition to (e.g., on top of) the non-conductive, single crystal buffer layer. Individual devices are then electrically isolated from each other by removing material around each photodiode device down to the non-conductive, single crystal buffer layer 20 or the semi-insulating substrate 15. Wet or dry chemical etches may be used for the material removal. The non-conductive, single crystal buffer layer may contain a single material or may contain multiple layers of different materials or a graded composition layer.

In one embodiment, the non-conductive buffer layer 20 (FIG. 4) between the semi-insulating substrate 15 and photodiode structures 18 and 19, which acts as a barrier to leakage current flow, is a single crystal semiconductor material having a bandgap greater than the bandgap of the semiconductor material comprising the semi-insulating substrate 15 and also greater than the bandgap of the adjacent semiconductor material 21 of the photodiode. Such non-conductive, single crystal buffer layer semiconductor material normally has a bandgap greater than 0.5 eV, and often greater than 1.0 eV.

The non-conductive, single crystal buffer layers can also be selected and employed based on the fabrication method of low temperature growth of a buffer layer (i.e., LTB) by molecular beam epitaxy (MBE). For example, an LTB, such as GaAs, can be referred to as LTB-GaAs. The LTB is prepared by reducing the temperature of the semi-insulating substrate to less than about 500 degrees C. during epitaxial growth and followed by a higher annealing temperature above about 700 degrees C. Methods that can be utilized to provide LTB produced non-conductive, single crystal buffer layers are described in "MICROSTRUCTURE OF ANNEALED LOW-TEMPERATURE-GROWN GaAs-LAYERS," authored by LILIENTALWEBER Z., CLAVERIE A., WASHBURN J., SMITH F., CALAWA R. in the *APPLIED PHYSICS A-MATERIALS SCIENCE & PROCESSING,* 53: (2)141–146 AUGUST 1991, and in "THE ROLE OF AS IN MOLECULAR-BEAM EPITAXY GaAs-LAYERS GROWN AT LOWTEMPERATURE," authored by LILIENTALWEBER Z., COOPER G., MARIELLA R., KOCOT C., in the *JOURNAL OF VACUUM SCIENCE & TECHNOLOGY,* B 9: (4) 2323–2327 JULY-AUGUST 1991, which are incorporated by reference herein. The LTB-GaAs has the property that the crystal lattice of the MBE layer has a significant level of naturally occurring defects which act to trap any charge that is injected into the lattice, yet retains adequate crystalline properties such that high quality layers can be grown on top of it. Similar structures are fabricated in 1 µm thick LTB-GaAs layers. Resulting current/voltage characteristics from testing such a structure show the current leakage is essentially eliminated where a current of only a few nanoamps is exhibited at 200 V bias.

The particular method of producing a non-conductive, single crystal buffer layer results in increasing the electrical traps in the predetermined (or chosen) initial single crystal, semiconductor material. Such methods can increase the physical defects in the crystal lattice. Furthermore, doping of the predetermined initial semiconductor material can create more traps.

Useful semi-insulating substrate materials and non-conductive, single crystal buffer layer materials include Group III–V semiconductor materials, such as GaAs, AlAs, InAs, and combinations thereof; InP, AlP, GaP, and combinations thereof; InGaAlPAs, InSb, GaSb, AlSb and combinations thereof; Group IV—IV semiconductor materials, such as SiGe, GaN, AlN, InN and combinations thereof; Group II–VI semiconductor materials such as ZnSe, HgCdTe, CdTe, and combinations thereof. Some of such materials have bandgaps less than 1 eV, which can lead to high concentrations of intrinsic electrical carriers rendering the material conductive or semi-conductive, not semi-insulating. However these same materials may be made semi-insulating or non-conductive through the addition of impurities or preparation techniques that add carrier traps reducing the number of electrical carriers. Some of these materials have bandgaps greater than 2 eV which generally renders them semi-insulating or non-conducting. Thus, such higher bandgap materials may also be useful as the non-conducting layer in the invention. For the present invention, the various levels of conductivity can be referred to as follows: for conductors having a bulk resistivity less than 10 ohm-cm, for semi-conductors having a bulk resistivity between 1e2 and 1e5 ohm-cm, for semi-insulating substrates having a bulk resistivity between 1e7 and 1e9 ohm-cm, and for non-conductors having a bulk resistivity greater than 1e9 ohm-cm.

Materials that have demonstrated excellent results for the non-conductive, single-crystal buffer layer are aluminum-arsenide (AlAs), aluminum-gallium-arsenide (AlGaAs), and Low-Growth-Temperature gallium-arsenide (LGT-GaAs).

Figure 5:
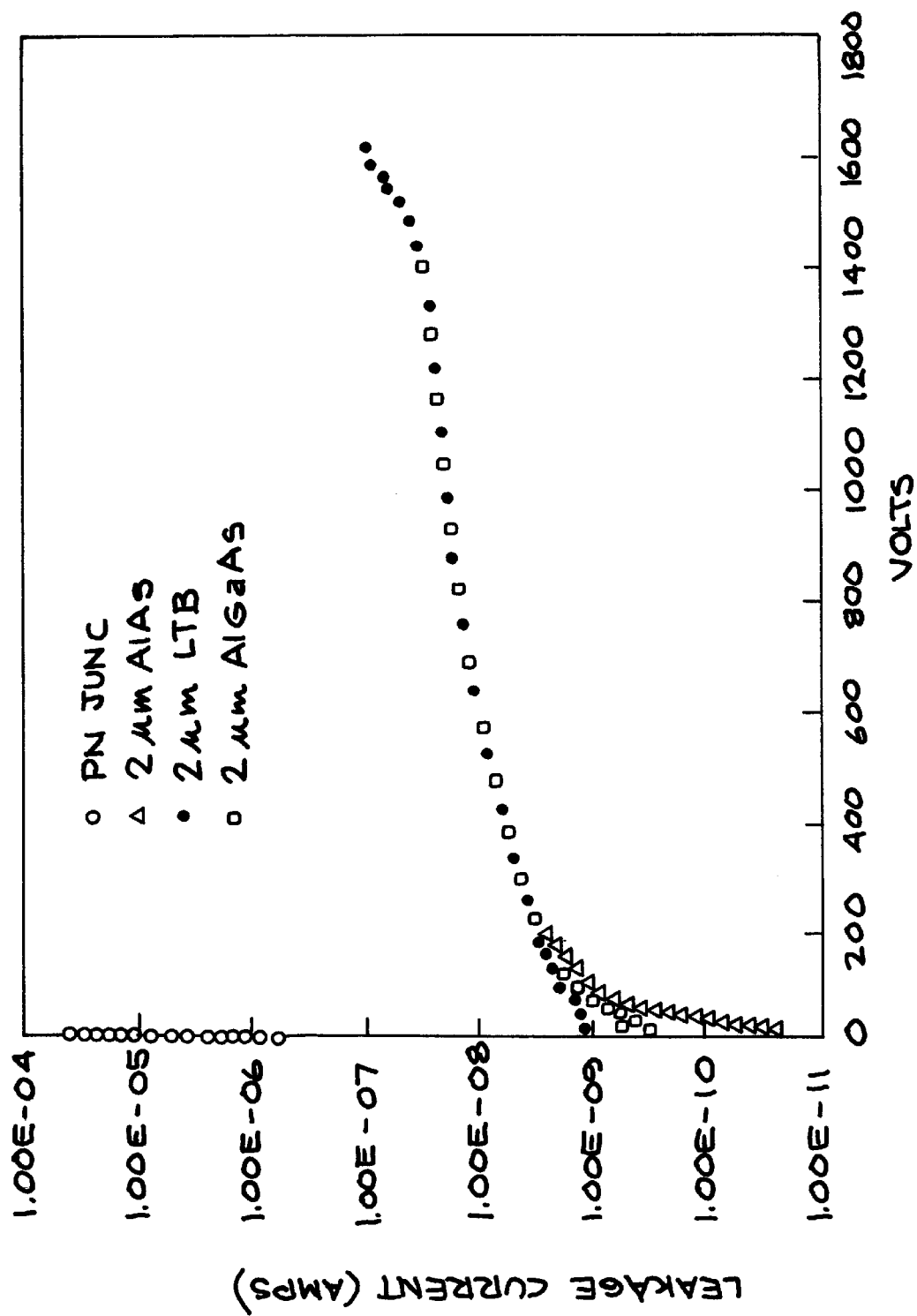
FIG. 5 illustrates, in graphical form, a comparison of minimal current leakage in three different non-conductive buffer layers to that of an isolated p-n junction.

FIG. 5 illustrates a comparison between arrays of photodiodes containing (1) a low temperature buffer (LTB) layer of about 2 micron thickness, (2) of about a 2 µm thick AlAs buffer, (3) of about a 2 µm thick AlGaAs buffer, and (4) non-buffered p-n junctions in isolated photodiode cells. At voltages greater than about 10 volts, and particularly above about 180 volts, such buffered photodiode cells of each array exhibits greater than 3 orders of magnitude reduction of leakage current compared to unbuffered p-n junction isolated photodiode cells. The leakage between the LTB and AlGaAs buffered devices remains low even out to 1400 volts.

Changes and modifications in the specifically described embodiments can be carried out without departing from the scope of the invention which is intended to be limited only by the scope of the claims.

We claim:

1. An array of photodiodes on a semi-insulating, single crystal semiconductor substrate, said array comprising:

a semi-insulating substrate;

at least one non-conductive buffer layer adjacent said substrate and having sufficient thickness to reduce charge injection compared to an otherwise same array without said buffer layer; and active photodiodes adjacent said non-conductive buffer layer, said photodiode comprising at least one layer having a single crystal semiconductor.

2. The array of claim 1 wherein said non-conductive buffer layer comprising a single crystal semiconductor having a direct bandgap greater than a bandgap of said single crystal semiconductor of said photodiode and greater than a bandgap of a single crystal semiconductor contained in said semi-insulating substrate.

3. The array of claim 1 wherein said non-conductive buffer layer is positioned between said photodiodes and said semi-insulating substrate.

4. The array of claim 1 wherein said non-conductive buffer layer is epitaxially grown upon said semi-insulating substrate.

5. The array of claim 1 wherein said non-conductive buffer layer comprises at least one single crystal semiconductor prepared by low temperature growth (LTB).

6. The array of claim 1 wherein said non-conductive buffer layer comprises AlAs, AlGaAs or GaAs.

7. The array of claim 1 wherein said photodiodes on said substrate are interconnected to produce more than 10 volts.

8. The array of claim 1 wherein said non-conductive buffer layer comprises a doped semiconductor material.

9. The array of claim 1 wherein a distance between adjacent rows of said photodiodes on said substrate is sufficient in the absence of said nonconductive buffer layer to provide a field strength between portions of each row that is high enough to inject current into said semi-insulating substrate resulting in a leakage current path between adjacent rows.

* * * * *